(12) United States Patent
Kim

(10) Patent No.: US 9,024,674 B1
(45) Date of Patent: May 5, 2015

(54) NEGATIVE LEVEL SHIFTER

(71) Applicant: Jong Cheol Kim, Goyang-si (KR)

(72) Inventor: Jong Cheol Kim, Goyang-si (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 14/150,590

(22) Filed: Jan. 8, 2014

(30) Foreign Application Priority Data

Nov. 27, 2013 (KR) .......................... 10-2013-0145115

(51) Int. Cl.
*H03L 5/00* (2006.01)
*H03K 19/0175* (2006.01)
*H03K 19/0185* (2006.01)

(52) U.S. Cl.
CPC ............... *H03K 19/017509* (2013.01); *H03K 19/018521* (2013.01); *H03K 19/018514* (2013.01); *H03K 19/018528* (2013.01)

(58) Field of Classification Search
CPC ............ H03K 19/018528; H03K 19/018521; H03K 19/018514
USPC ......... 327/333, 309, 318, 319, 323, 324, 327, 327/328, 54, 55, 67, 50, 51, 52, 57, 65; 326/63, 68, 69, 70, 71, 72, 73, 74, 80, 326/81

See application file for complete search history.

(56) References Cited

U.S. PATENT DOCUMENTS

| 5,497,023 | A  | * | 3/1996 | Nakazato et al. | ............. | 257/394 |
| 8,536,925 | B2 | * | 9/2013 | Bhattacharya et al. | ....... | 327/333 |
| 2009/0189665 | A1 | * | 7/2009 | Wu et al. | ....................... | 327/206 |

* cited by examiner

*Primary Examiner* — Jung Kim
(74) *Attorney, Agent, or Firm* — Andrew D. Fortney; Central California IP Group, P.C.

(57) ABSTRACT

A level shifter including a differential input stage including first and second transistors having respective first terminals, respective control terminals configured to receive a differential input signal, and respective second terminals connected in common to a first voltage; a breakdown voltage controller including third and fourth transistors having respective first terminals, respective second terminals connected to respective first terminals of the first and second transistors, and respective control terminals configured to receive a bias signal, and a load stage comprising fifth and sixth transistors having respective first terminals connected to respective first terminals of the third and fourth transistors, respective control terminals that are cross coupled, and respective second terminals connected to a second voltage is disclosed. A bias voltage applied to bulks or bodies of the first through the fourth transistors equals or substantially equals the first voltage.

20 Claims, 4 Drawing Sheets

|  | Junction | Maximum Voltage |
|---|---|---|
| M1,2 | Gate-Bulk | VDD + \|NPWR1\| |
| M3,4 | Drain-Bulk | \|NPWR2\| |
| M5,6 | Gate-Drain | \|NPWR2\| |
|  | Gate-Source (Bulk) | \|NPWR2\| |
|  | Drain-Source (Bulk) | \|NPWR2\| |
| M7,8 | Gate-Drain | \|NPWR2\| |
|  | Gate-Source (Bulk) | \|NPWR2\| - \|VDD-$V_{gs\_M1,2}$\| |
|  | Drain-Source (Bulk) | \|NPWR2\| |
| M9,10 | Gate-Drain | \|NPWR2\| |
|  | Gate-Source (Bulk) | \|NPWR2\| |
|  | Drain-Source (Bulk) | \|NPWR2\| |

NEGATIVE LEVEL SHIFTER

CROSS-REFERENCE TO RELATED APPLICATIONS

This application claims the benefit of the Korean Patent Application No. 10-2013-0145115, filed on Nov. 27, 2013, which is hereby incorporated by reference as if fully set forth herein.

BACKGROUND OF THE INVENTION

1. Field of the Invention

Embodiments of the present disclosure relate to a negative level shifter.

2. Discussion of the Related Art

Devices using a voltage different from an input voltage, such as flash memories and erasable programmable read only memories (EEPROMs), need a level shifter circuit for shifting the voltage level of an input signal to a high voltage or negative voltage level.

A circuit that shifts the voltage level of an input signal to a negative voltage level is referred to as a "negative level shifter circuit".

Generally, a level shifter capable of generating a signal swing or shift between a first voltage level and a second voltage level without exceeding breakdown voltage levels of devices configured to receive the signal may include two or more differential amplification stages. For implementation of two or more differential amplification stages, however, separate deep wells spaced apart from one another may be required. Since such separate deep wells are spaced apart from one another, the circuit size of the level shifter may be relatively large.

SUMMARY OF THE INVENTION

Embodiments of the present disclosure provide a level shifter having a reduced size and being capable of reducing consumption of current.

Additional advantages, objects, and features of the embodiments will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

To achieve these objects and other advantages and in accordance with the purpose of the embodiments of the present disclosure, as embodied and broadly described herein, a level shifter comprises a differential input stage including first and second transistors having respective first terminals (e.g., sources), respective control terminals (e.g., gates) configured to receive a differential input signal, and respective second terminals (e.g., drains) connected in common to a first voltage, a breakdown voltage controller including third and fourth transistors having respective first terminals (e.g., drains), respective second terminals (e.g., sources) connected to the respective second terminals of the first and second transistors, and the respective control terminals (e.g., gates) configured to receive a bias signal, and a load stage including fifth and sixth transistors having respective first terminals (e.g., drains) connected to the first terminals of the third and fourth transistors, respective control terminals (e.g., gates) that are cross coupled (e.g., to at least one terminal of the other of the load transistors), and respective second terminals (e.g., sources) connected to a second voltage, wherein bias voltages applied to bulks of the first through the fourth transistors equals or substantially equals the first voltage.

The first voltage may be a ground voltage (e.g., a system ground, on-chip ground, or a virtual ground potential). The bias voltage applied to the first and second transistors may be a third voltage. The second and third voltages may be first and second negative voltages, respectively. The third voltage may have a lower absolute value than the second voltage.

The first, second, fifth, and sixth transistors may be NMOS transistors, respectively. The third and fourth transistors may be PMOS transistors, respectively.

The sources and drains of the first to sixth transistors may be in a plurality of wells, and the plurality of wells may be in a single deep well.

The first transistor (e.g., of the differential input stage) may have a first source, a first drain connected to the first voltage, and a first gate that receives the first differential input signal (e.g., a true or complement thereof). The second transistor (e.g., of the differential input stage) may have a second source, a second drain connected to the first voltage, and a second gate that receives the second signal (e.g., the other of the true and complement of the differential input signal).

The third transistor (e.g., of the breakdown controller) may have a third drain, a third source connected to the first source, and a third gate that receives a corresponding bias voltage. The fourth transistor (e.g., of the breakdown controller) may have a fourth drain, a fourth source connected to the second source, and a fourth gate that receives a corresponding bias voltage.

The fifth transistor (e.g., of the load stage) may have a fifth gate, a fifth drain connected to the third drain, and a fifth source connected to the second voltage. The sixth transistor (e.g., of the load stage) may have a sixth gate, a sixth drain connected to the fourth drain, and a sixth source connected to the second voltage. The sixth gate may be connected to a first node to which the third drain and the fifth drain are connected. The fifth gate may be connected to a second node to which the fourth drain and the sixth drain are connected.

The level shifter may further include a differential amplification unit for differentially amplifying (i) a signal output from the first node, where the drains of the third and the fifth transistors are connected, and (ii) a signal output from the second node, where the drains of the fourth and sixth transistors are connected, and outputting an amplified signal.

The output signal from the differential amplification unit may have a maximum voltage level corresponding to the first voltage, and a minimum voltage level corresponding to the second voltage.

The differential amplification unit may include a seventh transistor having a seventh drain, a seventh gate that receives a first output signal from the first node, and a seventh source connected to the second voltage. In addition, the differential amplification unit may include an eighth transistor having an eighth drain, an eighth gate that receives a second output signal output from the second node, and an eighth source connected to the second voltage. Furthermore, the differential amplification unit may further include a ninth transistor having a ninth gate, a ninth source connected to the first voltage, and a ninth drain connected to the seventh drain. The differential amplification may include a tenth transistor having a tenth gate, a tenth source connected to the second voltage, and a tenth drain connected to the eighth drain. The ninth gate may be connected to the tenth drain, and the tenth gate may be connected to the ninth drain.

The level shifter may further include an inverter configured to invert the output signal from the differential amplification unit.

In another embodiment, a level shifter comprises a pair of first differential transistors having respective first terminals (e.g., sources), respective second terminals (e.g., drains) connected to a first voltage, and respective control terminals (e.g., gates) that receive a second signal inverted from the first signal; a pair of first load transistors having respective first terminals (e.g., drains), respective second terminals (e.g., sources) connected to a second voltage, and respective control terminals (e.g., gates) that are cross coupled (e.g., to at least one terminal of the other of the load transistors), and a pair of bias transistors having respective control terminals (e.g., gates) that receive a bias signal, respective first terminals (e.g., sources) connected to respective first terminals of the first differential transistors, and respective second terminals (e.g., drains) connected to respective second terminals of the load transistors, wherein the first and second terminals of the first differential transistors, the first load transistors, and the bias transistors are in a plurality of wells, and the plurality of wells are in a single deep well.

The single deep well may be a first-conductivity type deep well. The plurality of wells may include at least one first-conductivity type well and at least one second-conductivity type well.

The sources and drains of the first differential transistors may be in the second-conductivity type first well. The sources and drains of the first load transistors may be in the second-conductivity type second well. The sources and drains of the bias transistors may be in the first-conductivity type first well.

The first voltage may be applied to the first-conductivity type first well as a bias voltage. The second voltage may be applied to the second-conductivity type second well as a bias voltage. The third voltage may be applied to the second-conductivity type first well as a bias voltage.

The level shifter may further include a pair of second differential transistors having respective first terminals (e.g., drains), respective second terminals (e.g., sources) connected to the second voltage, and respective control terminals (e.g., gates) that receive signals from one or more nodes, respective first terminals of the bias transistors being connected to the one or more nodes, and a pair of second load transistors having respective first terminals (e.g., drains) connected to respective first terminals of the second differential transistors, respective second terminals (e.g., sources) connected to the first voltage, and respective control terminals (e.g., gates) that are cross coupled (e.g., to at least one terminal of the other of the load transistors).

Wells around the sources and drains of the second load transistors may be identical to the wells around the sources and drains of the bias transistors.

Wells around the sources and drains of the second load transistors may be identical to the wells around the sources and drains of the first load transistors.

The single deep well may be an N type deep well. The first-conductivity type well(s) may be an N type well. The second-conductivity type well(s) may be a P type well.

The embodiments of the present disclosure may reduce the size of the level shifter and consumption of current.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Figure 1:
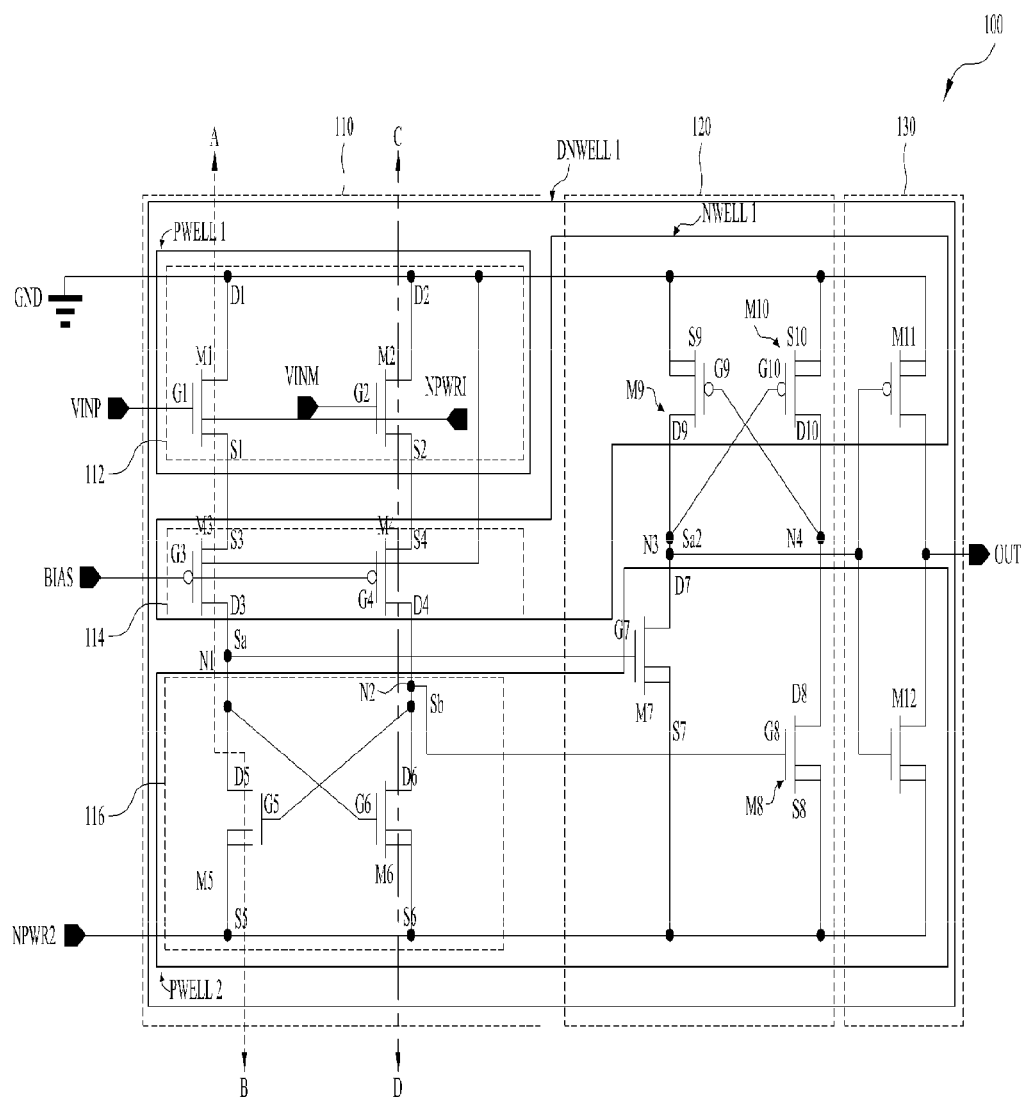
FIG. 1 is a circuit diagram illustrating a level shifter according to an exemplary embodiment of the present disclosure.

In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings.

In the drawings, dimensions of layers are exaggerated, omitted or schematically illustrated for clarity and convenience of description. In addition, dimensions of constituent elements do not entirely reflect actual dimensions thereof. The same reference numerals denote the same constituent elements, respectively. Hereinafter, a level shifter according to an embodiment will be described with reference to the accompanying drawings.

FIG. 1 is a circuit diagram illustrating an exemplary level shifter 100 according to embodiments of the present disclosure.

Referring to FIG. 1, the level shifter 100 includes a first differential amplification unit 110, a second differential amplification unit 120, and an output unit 130.

The first differential amplification unit 110 receives differential input signal VINP and VINM. The first differential amplification unit 110 differentially amplifies the received differential input signal VINP and VINM, and outputs amplified signal Sa/Sb, according to the differential amplification function of the first differential amplification unit 110.

The differential input signal may include a first signal VINP and a second, complementary signal VINM. The second, complementary signal VINM may be a signal inverted from, or having a value that is the inverse of, the first signal VINP.

For example, the first signal VINP and second, complementary signal VINM may be periodic signals, respectively having a first voltage level VDD and a second voltage level GND for part or all of one period. The first signal VINP and second signal VINM may have the same magnitude, while having opposite phases, respectively. Of course, first signal VINP and second signal VINM are not limited to the above-described conditions.

For example, the second signal VINM may be generated by inverting the first signal VINP, using an inverter (not shown). Thereafter, the first signal VINP may be delayed by an amount equal or substantially equal to the delay of the inverter that inverts the first signal VINP.

The first differential amplification unit 110 includes a differential input stage 112. The differential input stage 112 includes a pair of first differential transistors M1 and M2 that are configured to receive the differential signals VINP and VINM, respectively. The first differential amplification unit also includes a breakdown voltage controller 114 that includes a plurality of bias transistors M3 and M4, and a load stage 116 that includes a pair of first load transistors M5 and M6.

The first differential transistors M1 and M2 may include respective sources S1 and S2, respective gates G1 and G2 that receive respective input signals VINP and VINM, and respective drains D1 and D2 connected in common to a first voltage GND.

The load transistors M5 and M6 may include respective drains D5 and D6, respective sources S5 and S6 connected to a second voltage NPWR2, and respective gates G5 and G6 that are cross coupled.

The bias transistors M3 and M4 may include respective gates G3 and G4 configured to receive a bias signal BIAS, respective sources S3 and S4 connected to respective sources S1 and S2 of the first differential transistors M1 and M2, and respective drains D3 and D4 connected to respective drains D5 and D6 of the load transistors M5 and M6.

The first voltage GND, the second voltage NPWR2, and a third voltage NPWR1 that have different voltage levels, respectively, may be supplied to the first differential amplification unit 110.

For example, the first voltage GND may be a ground voltage (e.g., a system ground, an on-chip ground, or a virtual ground potential). The third voltage NPWR1 may have a lower absolute value than the second voltage NPWR2. The third voltage NPWR1 and second voltage NPWR2 may be negative voltages, lower than the first voltage GND. Of course, the voltages are not limited to the above-described conditions.

For example, the second voltage NPWR2 may be a maximum value of breakdown voltages (or rated voltages) of elements (for example, transistors) included in the level shifter 100.

For example, the first differential amplification unit 110 may include a differential input stage 112 including a first transistor M1 and a second transistor M2, a breakdown voltage controller 114 including a third transistor M3 and a fourth transistor M4, and a load stage 116 including a fifth transistor M5 and a sixth transistor M6.

The first and second transistors M1 and M2 may include respective sources S1 and S2, respective gates G1 and G2 configured to receive the input signal VINP and VINM, and respective drains D1 and D2 connected in common to the first voltage GND.

The third and fourth transistors M3 and M4 may include respective drains D3 and D4, respective sources S3 and S4 connected to respective sources S1 and S2 of the first and second transistors M1 and M2, and respective gates G3 and G4 that receive the bias signal BIAS. Each of the sources S3 and S4 of the third and fourth transistors M3 and M4 may be connected to a corresponding one S1 or S2 of the sources S1 and S2 of the first and second transistors M1 and M2.

The fifth and sixth transistors M5 and M6 may include respective drains D5 and D6 connected to respective drains D3 and D4 of the third and fourth transistors M3 and M4, respective gates G5 and G6 that are cross coupled (e.g., coupled to the drain D6 or D5 of the other transistor M6 or M5 of the load stage 116), and respective sources S5 and S6 connected to the second voltage NPWR2. The gate G5 of the fifth transistor M5 may be connected to the drain D6 of the sixth transistor M6. The gate G6 of the sixth transistor M6 may be connected to the drain D5 of the fifth transistor M5.

The first transistor M1 may include a first source S1, a first gate G1 configured to receive the first signal VINP, and a first drain D1 connected to the first voltage GND.

The second transistor M2 may include a second source S2, a second gate G2 configured to receive the second, complementary signal VINM, and a second drain D2 connected to the first voltage GND.

The first drain D1 and second drain D2 may be connected in common to the first voltage GND.

Bias voltages respectively applied to bulks (or bodies) of the first and second transistors M1 and M2 may be (or be equal or substantially equal to) the third voltage NPWR1.

The breakdown voltage controller 114 may control the voltage levels of output signal Sa/Sb from the first differential amplification unit 110 to range between the first voltage GND and the second voltage NPWR2.

The third transistor M3 may include a third drain D3, a third gate G3 configured to receive the bias signal BIAS, and a third source S3 connected to the first source S1 of the first transistor M1.

The fourth transistor M4 may include a fourth drain D4, a fourth gate G4 configured to receive the bias signal BIAS, and a fourth source S4 connected to the second source S2 of the second transistor M2.

The third gate G3 and fourth gate G4 may be connected such that the bias signal BIAS is applied to the third gate G3 and fourth gate G4 in common.

Bias voltages respectively applied to bulks (or bodies) of the third and fourth transistors M3 and M4 may be the first voltage GND.

The load stage 116 may function as a current buffer, for example, a constant current source).

The fifth transistor M5 may include a fifth source S5 connected to the second voltage NPWR2, a fifth drain D5 connected to the third drain D3 of the third transistor M3, and a fifth gate G5 connected to a node N2 between the fourth drain D4 and a sixth drain D6 of the sixth transistor M6.

The sixth transistor M6 may include a sixth source S6 connected to the second voltage NPWR2, and a sixth gate G6 connected to a node N1 between the third drain D3 and the fifth drain D5. The sixth drain D6, which is also included in the sixth transistor M6, is connected to the fourth drain D4 of the fourth transistor M4.

For example, the first transistor M1, second transistor M2, fifth transistor M5, and sixth transistor M6 may be NMOS transistors, respectively. The third transistor M3 and fourth transistor M4 may be PMOS transistors, respectively. Of course, these transistors are not limited to the above-described conditions. For example, the conductivity types of the transistors may be reversed.

Figures 2A, 2B:
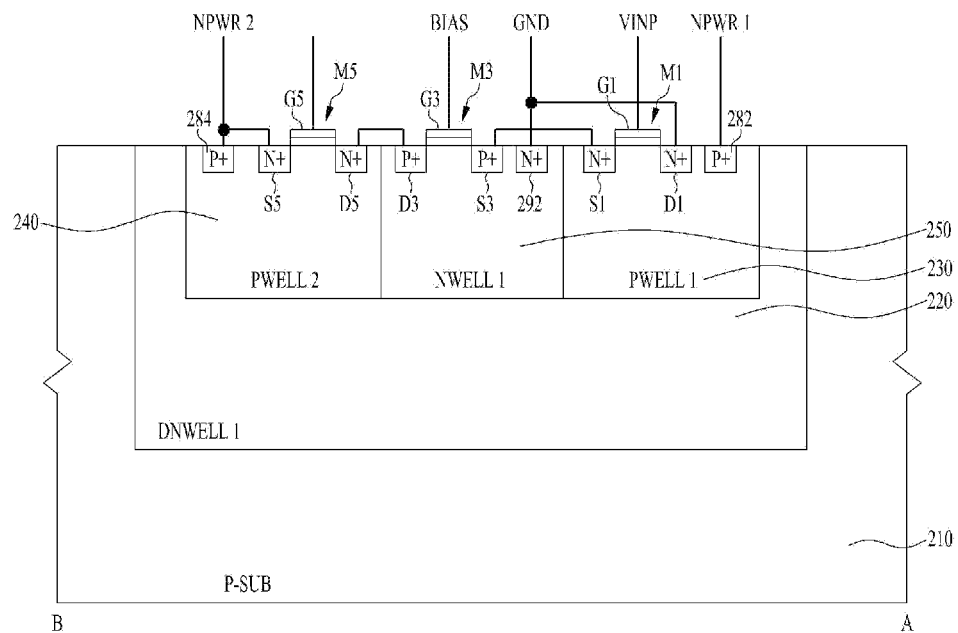
FIG. 2A is a cross-sectional view of the exemplary level shifter taken along a direction A-B, as shown in FIG. 1.
FIG. 2B is a cross-sectional view of the exemplary level shifter taken along a direction C-D, as shown in FIG. 1.

FIG. 2A is a cross-sectional view of the level shifter 100 taken along a direction A-B, as shown in FIG. 1. FIG. 2B is a cross-sectional view of the level shifter 100 taken along a direction C-D, as shown in FIG. 1.

Referring to FIGS. 2A and 2B, the sources and drains of the first differential transistors M1 and M2, bias transistors M3 and M4, and first load transistors M5 and M6 may be formed in a plurality of wells (for example, wells 230, 240, and 250) that are formed in a single deep well 220.

The single deep well 220 may be a first-conductivity type deep well DNWELL1. The plural wells (for example, the wells 230, 240, and 250) may include at least one first-conductivity type well (for example, the well 250), and at least one second-conductivity type well (for example, the wells 230 and/or 240).

For example, the first-conductivity type deep well DNWELL1 may be an N type deep well. The first-conductivity type well 250 may be an N type well. Each of the second-conductivity type wells 230 and 240 may be a P type well. Of course, the wells are not limited to the above-described conditions.

For example, the sources S1 and S2 and drains D1 and D2 of the first differential transistors M1 and M2 may be formed in the second-conductivity type first well 230. The third voltage NPWR1 may be applied to the second-conductivity type first well 230, as a bias voltage. A second-conductivity type first impurity doped region 282, to which the third voltage NPWR1 is electrically connected, may be formed in the second-conductivity type first well 230.

The sources S5 and S6 and drains D5 and D6 of the first load transistors M5 and M6 may be formed in the second-conductivity type second well 240. The second voltage NPWR2 may be applied to the second-conductivity type second well 240, as a bias voltage. A second-conductivity type second impurity doped region 284, to which the second voltage NPWR2 is electrically connected, may be formed in the second-conductivity type second well 240.

The sources S3 and S4 and drains D3 and D4 of the bias transistors M3 and M4 may be formed in the first-conductivity type first well 250. The first voltage GND may be applied to the first-conductivity type first well 250, as a bias voltage. A first-conductivity type first impurity doped region 292, to which the first voltage GND is electrically connected, may be formed in the first-conductivity type first well 250.

For example, the first-conductivity type deep well DNWELL1 (220) may be a first-conductivity type (for example, N type) impurity doped region formed in a substrate 210.

The second-conductivity type first well 230 and second-conductivity type second well 240 may be second-conductivity type (for example, P type) impurity doped regions formed in different regions of the first-conductivity type deep well 220, respectively. The first-conductivity type first well 250 may be a first-conductivity type (for example, N type) formed in another region of the first-conductivity type deep well 220.

Figure 3:
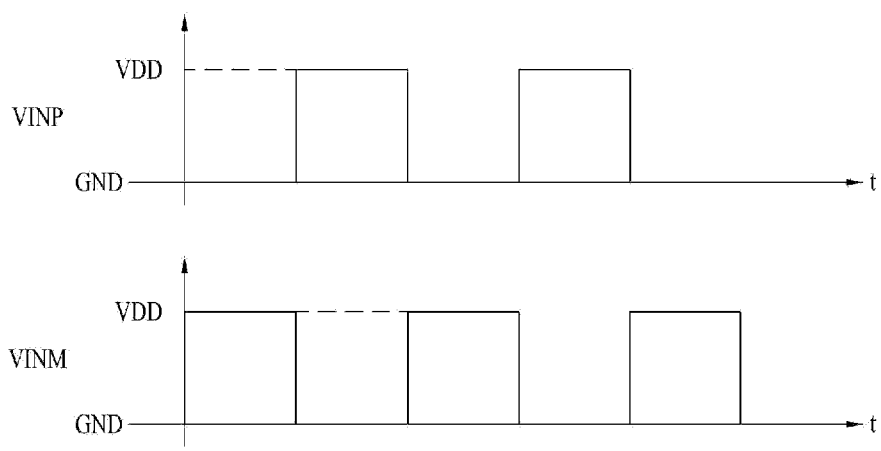
FIG. 3 is a waveform diagram depicting input signals of a first differential amplification unit illustrated in FIG. 1.
Figure 4:
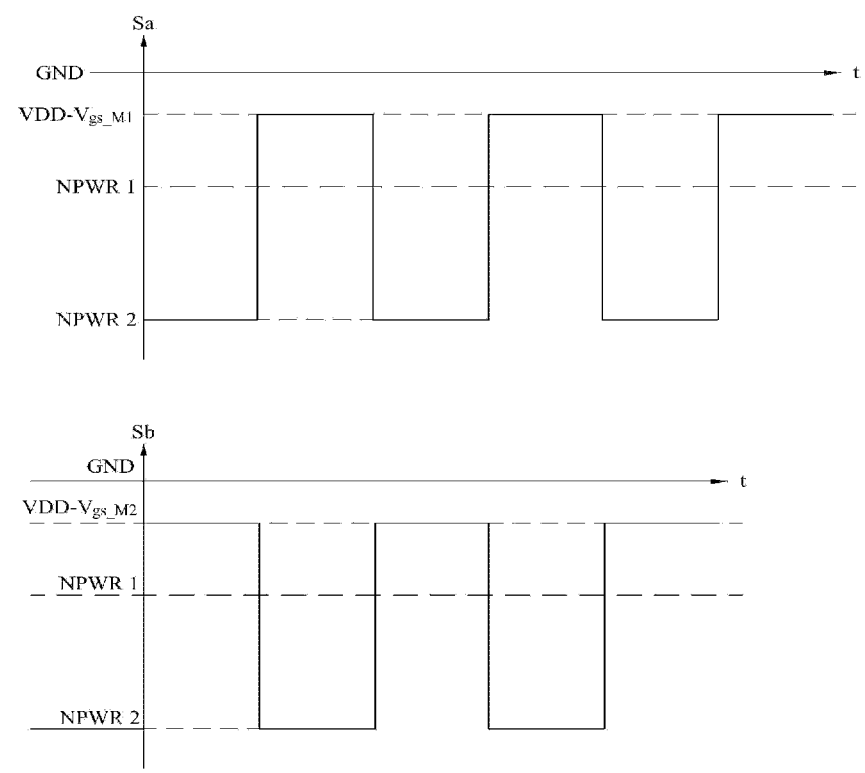
FIG. 4 is a waveform diagram depicting output signals from the first differential amplification unit illustrated in FIG. 1.
Figures 5, 6:
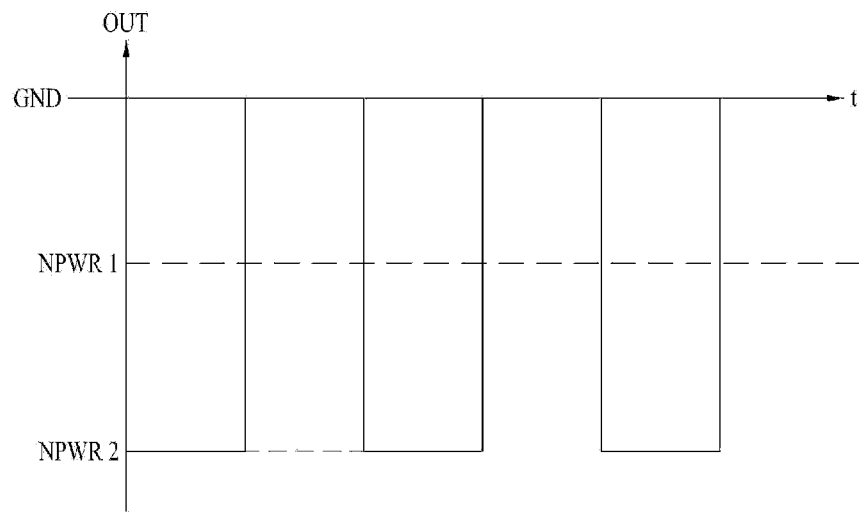
FIG. 5 is a waveform diagram depicting an output signal from an exemplary output unit illustrated in FIG. 1.
FIG. 6 is a table illustrating junction voltages of transistors included in first and second differential amplification units illustrated in FIG. 1.

FIG. 3 depicts the input signals VINP and VINM of the exemplary first differential amplification unit 110 illustrated in FIG. 1. FIG. 4 depicts the output signals Sa and Sb from the exemplary first differential amplification unit 110 illustrated in FIG. 1. FIG. 5 depicts an output signal OUT from the exemplary output unit 130 illustrated in FIG. 1.

Referring to FIGS. 3 to 5, the output signal Sa/Sb from the first differential amplification unit 110 may be a differential signal obtained by negative level shifting of the differential input signal VINP/VINM, respectively.

For example, when the first input signal VINP has a first voltage level VDD, and the second input signal VINM has a second voltage level GND, the amount of current flowing through the sixth drain D6 of the sixth transistor M6 is greater than the amount of current flowing through the fifth drain D5 of the fifth transistor M5. As a result, the output voltage Sa at the first node N1 may increase. In accordance with an increase in the output voltage Sa at the first node N1, the voltage at the sixth gate G6 of the sixth transistor M6 increases, and the output voltage Sb at the second node N2 may become the second voltage NPWR2.

The first node N1 may be a connection point between the third drain D3 of the third transistor M3 and the fifth drain D5 of the fifth transistor M5. The second node N2 may be a connection point between the fourth drain D4 of the fourth transistor M4 and the sixth drain D6 of the sixth transistor M6. The first node N1 and second node N2 may be a differential output stage of the first differential amplification unit 110. The output voltages at the second nodes N1 and N2 may be output voltages of the first differential amplification unit 110, respectively.

The output voltage Sa at the first node N1 may have a lower voltage level than the first voltage level GND, for example, a voltage level of VDD–Vgs[M1]. For example, when the gate-source voltage of the first transistor M1, Vgs[M1], becomes higher than the first voltage level VDD through adjustment and/or application of the bias voltage BIAS, the output voltage Sa at the first node N1 may have a voltage level of VDD–Vgs[M1], which may be lower than the first voltage level GND.

Meanwhile, when the first input signal VINP has the second voltage level GND, and the second input signal VINM has the first voltage level VDD, the amount of current flowing through the fifth drain D5 of the fifth transistor M5 is greater than the amount of current flowing through the sixth drain D6 of the sixth transistor M6. As a result, the output voltage Sb at the second node N2 may increase. In accordance with an increase in the output voltage Sb at the second node N2, the voltage at the fifth gate G5 of the fifth transistor M5 increases and the output voltage Sa at the first node N1 may become the second voltage NPWR2.

The output voltage Sb at the second node N2 may have a lower voltage level than the first voltage level GND, for example, a voltage level of VDD–Vgs[M2]. For example, when the gate-source voltage of the second transistor M2, Vgs[M2], becomes higher than the first voltage level VDD through adjustment and/or application of the bias voltage BIAS, the output voltage Sb at the second node N2 may have a voltage level of VDD–Vgs[M2], which may be lower than the first voltage level GND.

The second differential amplification unit 120 amplifies the differential output signal Sa/Sb from the first differential amplification unit 110, and converts the differential signal Sa/Sb to a single-ended signal Sa2.

The second differential amplification unit 120 may pull up the voltage levels of the differential output signal Sa/Sb from the first differential amplification unit 110 to the first voltage level GND, and may pull down the voltage levels of the differential output signal Sa/Sb to the level of the second voltage NPWR2. The output signal of the second differential amplification unit 120 may have a maximum voltage level corresponding to the first voltage level GND, and a minimum voltage level corresponding to the level of the second voltage NPWR2.

The second differential amplification unit 120 may include a pair of second differential transistors M7 and M8 that receive the first output signal Sa from the first differential amplification unit 110 as a first input, and the second output signal Sb from the first differential amplification unit 110 as a second input. The second differential amplification unit 120 may also include a pair of second load transistors M9 and M10.

The second differential transistors M7 and M8 may include respective drains D7 and D8, respective sources S7 and S8 connected to the second voltage NPWR2, and respective gates G7 and G8 configured to receive respective signals Sa and Sb from the first and second nodes N1 and N2. As described above, respective drains D5 and D6 of the first load transistors M5 and M6, and respective drains D3 and D4 of the bias transistors M3 and M4 are connected to the first and second nodes N1 and N2.

The second load transistors M9 and M10 may include respective drains D9 and D10 connected to respective drains D7 and D8 of the second differential transistors M7 and M8, respective sources S9 and S10 connected to the first voltage GND, and respective cross coupled gates G9 and G10.

"Cross-coupled gates" for example, the gates G9 and G10), refers to an arrangement or configuration in which the gate of one of the second load transistors M9 and M10 for example, the gate G9 of the transistor M9) is connected to the drain D10 of the other transistor M10, and vice versa (e.g., the gate G10 of the transistor M10 is connected to the drain D9 of the other transistor M9).

For example, the second differential transistors M7 and M8 may comprise a second transistor M7 and an eighth transistor M8, respectively. The second load transistors M9 and M10 may comprise a ninth transistor M9 and a tenth transistor M10, respectively.

The seventh transistor M7 may include a seventh drain D7, a seventh gate G7 configured to receive the first output signal Sa, and a seventh source S7 connected to the second voltage NPWR2.

The eighth transistor M8 may include an eighth drain D8, an eighth gate G8 configured to receive the second output signal Sb, and an eighth source S8 connected to the second voltage NPWR2.

The ninth transistor M9 may include a ninth gate G9, a ninth source S9 connected to the first voltage GND, and a ninth drain D9 connected to the seventh drain D7.

The tenth transistor M10 may include a tenth gate G10, a tenth source S10 connected to the second voltage NPWR2, and a tenth drain D10 connected to the eighth drain D8.

The ninth gate G9 may be connected to the tenth drain D10, whereas the tenth gate G10 may be connected to the ninth drain D9.

The output stage of the second differential amplification unit 120 may include third and fourth nodes N3 and N4 to which respective drains D7 and D8 of the second differential transistors M7 and M8 and respective drains D9 and D10 of the second load transistors M9 and M10 are connected. Alternatively, the output node of the second differential application unit 120 may comprise node N3 alone.

The output unit 130 inverts the output signal Sa2 from the second differential amplification unit 120, and outputs a signal OUT, according to an inversion function of the output unit 130.

For example, the output unit 130 may invert an output signal from at least one of the third and fourth nodes N3 and N4 for example, the signal Sa2, and may invert one of the signals at the third or fourth node N3 or N4 as a single-ended output signal.

The output unit 130 may be implemented in the form of a CMOS inverter including a PMOS transistor M11 and an NMOS transistor M12. Of course, the output unit 130 is not limited to the above-described configuration.

Wells PWELL1, PWELL2, and NWELL1, constituting the first differential amplification unit 110, wells PWELL1, PWELL2, and NWELL1 constituting the second differential amplification unit 120, and wells PWELL2 and NWELL1 constituting the transistors M11 and M12 of the output unit 130 may be formed in the single deep well DNWELL1.

The sources S7 and S8 and drains D7 and D8 of the second differential transistors M7 and M8 may be formed in the second-conductivity type second well PWELL2. For example, the wells where the sources S7 and S8 and drains D7 and D8 of the second differential transistors M7 and M8 formed may be identical to the well PWELL2 where the sources S5 and S6 and drains D5 and D6 of the first differential transistors M5 and M6 in the load stage 116 are located, and be formed in the same processing step(s).

The sources S9 and S10 and drains D9 and D10 of the second load transistors M9 and M10 may be formed in the first-conductivity type first well NWELL1.

For example, the wells in which the sources S9 and S10 and drains D9 and D10 of the second load transistors M9 and M10 are formed may be identical to the well NWELL1 in which the sources S3 and S4 and drains D3 and D4 of the bias transistors M3 and M4 in the breakdown voltage controller 114 are formed, and may be formed during the same processing step(s).

The source and drain of the PMOS transistor M11 in the output unit 130 may be formed in the first-conductivity type first well. The source and drain of the NMOS transistor M12 in the output unit 130 may be formed in the second-conductivity type second well PWELL2.

FIG. 6 illustrates junction voltages of the transistors included in the first and second differential amplification units illustrated in FIG. 1.

Referring to FIG. 6, junction voltages Gate-Bulk, Drain-Bulk, Gate-Source, Drain-Source, and Gate-Drain of the transistors M1 to M10 included in the first and second differential amplification units 110 and 120, do not exceed the second voltage NPWR2. The second voltage NPWR2 is a maximum breakdown voltage. The sum of the absolute values of the voltage VDD and third voltage NPWR1 of the differential input signals does not exceed the second voltage NPWR2.

Thus, embodiments of the present disclosure may prevent erroneous level shifting and damage to or breakdown of elements (for example, transistors) because the embodiments of the present disclosure may be implemented without exceeding breakdown voltages of the elements.

Embodiments of the present disclosure may reduce the size of the level shifter 100 because the first differential amplification unit 110 and second differential amplification unit 120 are configured, using a single first-conductivity type deep well (e.g., DNWELL1).

Embodiments of the present disclosure may reduce the total number of transistors and reduce the amount of current consumed during operation because there are two amplification stages.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A level shifter comprising:
   a differential input stage comprising first and second transistors having respective first terminals, respective control terminals configured to receive a differential input signal, and respective second terminals connected in common to a first voltage;
   a breakdown voltage controller comprising third and fourth transistors having respective first terminals, respective second terminals connected to respective first terminals of the first and second transistors, and respective control terminals configured to receive a bias signal; and a load stage comprising fifth and sixth transistors having respective first terminals connected to respective first terminals of the third and fourth transistors, respective control terminals that are cross coupled, and respective second terminals connected to a second voltage, wherein a bias voltage applied to a bulk of each of the first and second transistors is a third voltage, the first voltage is a ground voltage, the second and third voltages are first and second negative voltages, respectively, and the third voltage has a lower absolute value than the second voltage.

2. The level shifter according to claim 1, wherein the first voltage is a ground voltage.

3. The level shifter according to claim 1, wherein the first, second, fifth, and sixth transistors are NMOS transistors, respectively, and the third and fourth transistors are PMOS transistors, respectively.

4. The level shifter according to claim 1, wherein the sources and drains of the first to sixth transistors are in a plurality of wells, and the plurality of wells are in a single deep well.

5. The level shifter according to claim 1, wherein:
the first transistor of the differential input stage comprises a first source, a first drain connected to the first voltage, and a first gate configured to receive a true or complement of the first differential input signal; and
the second transistor of the differential input stage has a second source, a second drain connected to the first voltage, and a second gate configured to receive the other of the true or complement of the first differential signal.

6. The level shifter according to claim 5, wherein:
the third transistor of the breakdown controller has a third drain, a third source connected to the first source, and a third gate configured to receive the bias voltage of the breakdown voltage controller; and
the fourth transistor of the breakdown controller has a fourth drain, a fourth source connected to the second source, and a fourth gate configured to receive the bias voltage of the breakdown voltage controller.

7. The level shifter according to claim 6, wherein:
the fifth transistor of the load stage has a fifth gate, a fifth drain connected to the third drain, and a fifth source connected to the second voltage;
the sixth transistor of the load stage has a sixth gate, a sixth drain connected to the fourth drain, and a sixth source connected to the second voltage; and
the sixth gate is connected to a first node to which the third drain and the fifth drain are connected, and the fifth gate is connected to a second node to which the fourth drain and the sixth drain are connected.

8. The level shifter according to claim 7, further comprising:
a differential amplification unit for differentially amplifying (i) a signal output from the first node where drains of the third and the fifth transistors are connected, and (ii) a signal output from the second node where drains of the fourth and sixth transistors are connected, and outputting an amplified signal.

9. The level shifter according to claim 8, wherein the output signal from the differential amplification unit has a maximum voltage level corresponding to the first voltage, and a minimum voltage level corresponding to the second voltage.

10. A level shifter, comprising:
a differential input stage comprising first and second transistors having respective first terminals, respective control terminals configured to receive a differential input signal, and respective second terminals connected in common to a first voltage;
a breakdown voltage controller comprising third and fourth transistors having respective first terminals, respective second terminals connected to respective first terminals of the first and second transistors, and respective control terminals configured to receive a bias signal;
a load stage comprising fifth and sixth transistors having respective first terminals connected to respective first terminals of the third and fourth transistors, respective control terminals that are cross coupled, and respective second terminals connected to a second voltage; and
a differential amplification unit for differentially amplifying (i) a signal output from a first node where drains of the third and the fifth transistors are connected, and (ii) a signal output from a second node where drains of the fourth and sixth transistors are connected, and outputting an amplified signal, wherein the differential amplification unit comprises:
a seventh transistor having a seventh drain, a seventh gate configured to receive a first output signal from the first node, and a seventh source connected to the second voltage;
an eighth transistor having an eighth drain, an eighth gate configured to receive a second output signal output from the second node, and an eighth source connected to the second voltage;
a ninth transistor having a ninth gate, a ninth source connected to the first voltage, and a ninth drain connected to the seventh drain; and
a tenth transistor having a tenth gate, a tenth source connected to the first voltage, and a tenth drain connected to the eighth drain, wherein the ninth gate is connected to the tenth drain, and the tenth gate is connected to the ninth drain.

11. The level shifter according to claim 10, wherein a bias voltage applied to the first and second transistors is a third voltage, the first voltage is a ground voltage, the second and third voltages are first and second negative voltages, respectively, and the third voltage has a lower absolute value than the second voltage.

12. The level shifter according to claim 8, further comprising an inverter configured to invert the output signal from the differential amplification unit.

13. A level shifter comprising:
a pair of first differential transistors having respective first terminals, respective second terminals connected to a first voltage, and respective control terminals configured to receive a first signal and a second signal inverted from the first signal;
a pair of first load transistors having respective first terminals, respective second terminals connected to a second voltage, and respective control terminals that are cross coupled; and
a pair of bias transistors having respective control terminals configured to receive a bias signal, respective first terminals connected to respective first terminals of the first differential transistors, and respective second terminals connected to respective first terminals of the load transistors,
wherein the first and second terminals of the first differential transistors are in a second-conductivity type first well, the first and second terminals of the first load transistors are in a second-conductivity type second well, the first and second terminals of the bias transistors are in a first-conductivity type first well, and the first-conductivity type first well and the second-conductivity type first and second wells are in a single first-conductivity type deep well.

14. The level shifter according to claim 13, wherein the first voltage is applied to the first-conductivity type first well as a bias voltage, the second voltage is applied to the second-conductivity type second well as a bias voltage, and the third voltage is applied to the second-conductivity type first well as a bias voltage.

15. The level shifter according to claim 13, further comprising:
   a pair of second differential transistors having respective first terminals, respective second terminals connected to the second voltage, and respective control terminals configured to receive signals output from one or more nodes, respective first terminals of the bias transistors being connected to the one or more nodes; and
   a pair of second load transistors having respective first terminals connected to respective first terminals of the second differential transistors, respective second terminals connected to the first voltage, and respective control terminals that are cross coupled.

16. The level shifter according to claim 15, wherein the wells around the first and second terminals of the second load transistors are identical to the wells around the first and second terminals of the bias transistors.

17. The level shifter according to claim 15, wherein the wells around the first and second terminals of the second load transistors are identical to the wells around the first and second terminals of the first load transistors.

18. The level shifter according to claim 13, wherein the single deep well is an N type deep well, the first-conductivity type first well is an N type well, and the second-conductivity type first and second wells are a P type well.

19. The level shifter according to claim 10, wherein the first voltage is a ground voltage.

20. The level shifter according to claim 10, wherein the first, second, fifth, and sixth transistors are NMOS transistors, and the third and fourth transistors are PMOS transistors.

* * * * *